(12) United States Patent
Huang

(10) Patent No.: US 12,075,608 B2
(45) Date of Patent: Aug. 27, 2024

(54) MULTI-GATE SEMICONDUCTOR DEVICE FOR MEMORY AND METHOD FOR FORMING THE SAME

(71) Applicant: TAIWAN SEMICONDUCTOR MANUFACTURING COMPANY LTD., Hsinchu (TW)

(72) Inventor: Huai-Ying Huang, Taipei County (TW)

(73) Assignee: TAIWAN SEMICONDUCTOR MANUFACTURING COMPANY LTD., Hsinchu (TW)

( * ) Notice: Subject to any disclaimer, the term of this patent is extended or adjusted under 35 U.S.C. 154(b) by 176 days.

(21) Appl. No.: 17/377,790

(22) Filed: Jul. 16, 2021

(65) Prior Publication Data

US 2023/0015575 A1 Jan. 19, 2023

(51) Int. Cl.
*H10B 10/00* (2023.01)
*G11C 11/412* (2006.01)

(52) U.S. Cl.
CPC .......... *H10B 10/125* (2023.02); *G11C 11/412* (2013.01)

(58) Field of Classification Search
None
See application file for complete search history.

(56) References Cited

U.S. PATENT DOCUMENTS

| | | | |
|---|---|---|---|
| 9,209,247 B2 | 12/2015 | Colinge et al. | |
| 9,236,267 B2 | 1/2016 | De et al. | |
| 9,412,817 B2 | 8/2016 | Yang et al. | |
| 9,412,828 B2 | 8/2016 | Ching et al. | |
| 9,472,618 B2 | 10/2016 | Oxland | |
| 9,502,265 B1 | 11/2016 | Jiang et al. | |
| 9,520,482 B1 | 12/2016 | Chang et al. | |
| 9,536,738 B2 | 1/2017 | Huang et al. | |
| 9,576,814 B2 | 2/2017 | Wu et al. | |
| 9,608,116 B2 | 3/2017 | Ching et al. | |
| 2010/0315859 A1* | 12/2010 | Lee ........................ | G11C 11/412 365/230.05 |
| 2014/0133218 A1* | 5/2014 | Liaw ..................... | G11C 11/412 438/283 |
| 2014/0254248 A1* | 9/2014 | Huang .................. | G11C 11/419 365/154 |
| 2017/0256549 A1* | 9/2017 | Keng ................... | H01L 29/7827 |
| 2020/0135740 A1* | 4/2020 | Liaw ..................... | B82Y 10/00 |
| 2020/0365464 A1* | 11/2020 | Sreenivasan .... | H01L 21/823807 |

* cited by examiner

*Primary Examiner* — Khaja Ahmad

(74) *Attorney, Agent, or Firm* — WPAT LAW; Anthony King

(57) ABSTRACT

A memory device includes a first SRAM cell, a second SRAM cell, a first inter transistor and a second inter transistor. The first SRAM cell includes two first pull-up transistors, two first pull-down transistors, and two first pass-gate transistors. The second SRAM cell includes two second pull-up transistors, two second pull-down transistors, and two second pass-gate transistors. The first inter transistor and the second inter transistor are electrically connected to the first SRAM cell and the second SRAM cell.

20 Claims, 11 Drawing Sheets

MULTI-GATE SEMICONDUCTOR DEVICE FOR MEMORY AND METHOD FOR FORMING THE SAME

BACKGROUND

As the semiconductor industry develops smaller and smaller nanoscale products and related processes in pursuit of greater device density, higher performance, and lower costs, the challenges of downscaling both fabrication and design have led to the development of three-dimensional designs, such as multi-gate field-effect transistors (FET), including a fin FET (FinFET) and a gate-all-around (GAA) FET. In a FinFET, a gate electrode is positioned adjacent to three side surfaces of a channel region with a gate dielectric layer interposed therebetween. Because such gate structure surrounds a fin on three sides, the FinFET essentially has three gates controlling a current through a fin or channel region. However, a fourth side, that is, a bottom part of the channel region, is positioned far away from the gate electrode and thus is not under close gate control. In contrast to a FinFET, a GAA FET includes an arrangement wherein all side surfaces of the channel region are surrounded by the gate electrode, allowing fuller depletion in the channel region and resulting in fewer short-channel effects due to a steeper sub-threshold current swing (SS) and smaller drain-induced barrier lowering (DIBL).

Although existing GAA FET devices and methods of fabricating GAA FET devices have been generally adequate for their intended purposes, such devices and methods have not been entirely satisfactory in all aspects.

BRIEF DESCRIPTION OF THE DRAWINGS

Aspects of the present disclosure are best understood from the following detailed description when read with the accompanying figures. It is noted that, in accordance with the standard practice in the industry, various features are not drawn to scale. In fact, the dimensions of the various features may be arbitrarily increased or reduced for clarity of discussion.

FIG. 13A is also a cross-sectional view taken along line I-I' of FIG. 14, and FIG. 13B is also a cross-sectional view taken along line II-II' of FIG. 14.

DETAILED DESCRIPTION

Figure 1:
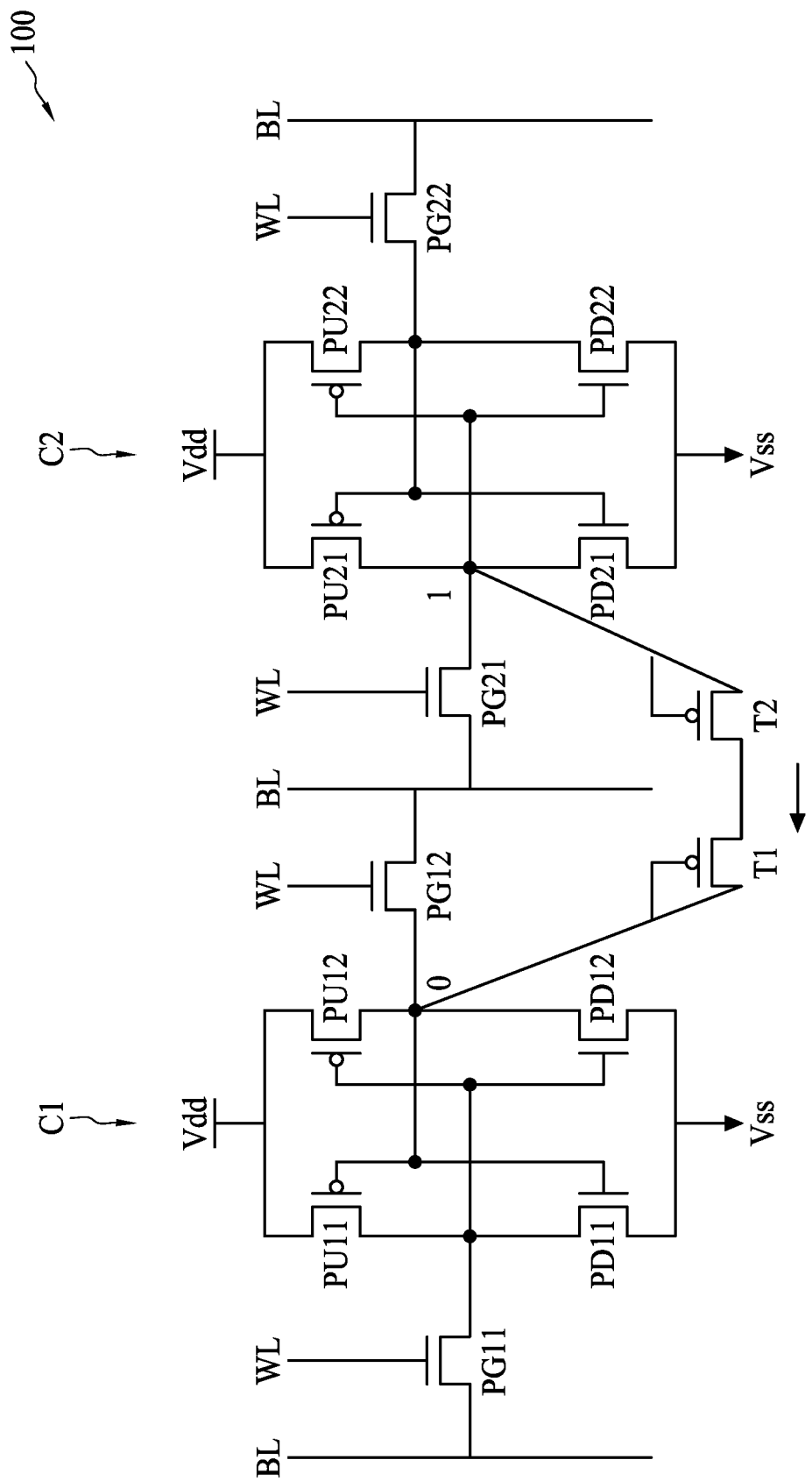
FIG. 1 shows a circuit diagram of a memory device according to aspects of the present disclosure.

The following disclosure provides many different embodiments, or examples, for implementing different features of the provided subject matter. Specific examples of components and arrangements are described below to simplify the present disclosure. These are, of course, merely examples and are not intended to be limiting. For example, the formation of a first feature over or on a second feature in the description that follows may include embodiments in which the first and second features are formed in direct contact, and may also include embodiments in which additional features may be formed between the first and second features, such that the first and second features may not be in direct contact. In addition, the present disclosure may repeat reference numerals and/or letters in the various examples. This repetition is for the purpose of simplicity and clarity and does not in itself dictate a relationship between the various embodiments and/or configurations discussed.

Further, spatially relative terms, such as "beneath," "below," "lower," "above," "upper," "on" and the like, may be used herein for ease of description to describe one element or feature's relationship to another element(s) or feature(s) as illustrated in the figures. The spatially relative terms are intended to encompass different orientations of the device in use or operation in addition to the orientation depicted in the figures. The apparatus may be otherwise oriented (rotated 90 degrees or at other orientations) and the spatially relative descriptors used herein may likewise be interpreted accordingly.

As used herein, terms such as "first," "second" and "third" describe various elements, components, regions, layers and/or sections, but these elements, components, regions, layers and/or sections should not be limited by these terms. These terms may be only used to distinguish one element, component, region, layer or section from another. The terms such as "first," "second" and "third" when used herein do not imply a sequence or order unless clearly indicated by the context.

Notwithstanding that the numerical ranges and parameters setting forth the broad scope of the disclosure are approximations, the numerical values set forth in the specific examples are reported as precisely as possible. Any numerical value, however, inherently contains certain errors necessarily resulting from the standard deviation found in the respective testing measurements. Also, as used herein, the terms "substantially," "approximately" or "about" generally mean within a value or range that can be contemplated by people having ordinary skill in the art. Alternatively, the terms "substantially," "approximately" or "about" mean within an acceptable standard error of the mean when considered by one of ordinary skill in the art. People having ordinary skill in the art can understand that the acceptable standard error may vary according to different technologies. Other than in the operating/working examples, or unless otherwise expressly specified, all of the numerical ranges, amounts, values and percentages such as those for quantities of materials, durations of times, temperatures, operating conditions, ratios of amounts, and the likes thereof disclosed herein should be understood as modified in all instances by the terms "substantially," "approximately" or "about." Accordingly, unless indicated to the contrary, the numerical parameters set forth in the present disclosure and attached claims are approximations that can vary as desired. At the very least, each numerical parameter should be construed in light of the number of reported significant digits and by applying ordinary rounding techniques. Ranges can be expressed herein as being from one endpoint to another endpoint or between two endpoints. All ranges disclosed herein are inclusive of the endpoints, unless specified otherwise.

The gate-all-around (GAA) transistor structures may be patterned by any suitable method. For example, the structures may be patterned using one or more photolithography processes, including double-patterning or multi-patterning processes. Generally, double-patterning or multi-patterning processes combine photolithography and self-aligned processes, allowing patterns to be created that have, for example, pitches smaller than what is otherwise obtainable using a single, direct photolithography process. For example, in one embodiment, a sacrificial layer is formed over a substrate and patterned using a photolithography process. Spacers are formed alongside the patterned sacrificial layer using a self-aligned process. The sacrificial layer is then removed, and the remaining spacers may then be used to pattern the GAA structure.

Static random access memory (SRAM) is commonly used in integrated circuits. SRAM cells have the advantageous feature of holding data without a need for refreshing. SRAM cells may include different numbers of transistors and are accordingly often referred to by the number of transistors, for example, six-transistor (6-T) SRAM, eight-transistor (8-T) SRAM, and the like. The transistors typically form a data latch for storing a bit. Additional transistors may be formed to construct core or logic circuits to control access to the transistors.

In some embodiments, in accordance with the ongoing down-scaling of integrated circuits, multi-gate semiconductor devices (i.e., multi-gate transistors) are used to form the SRAM cells. It should be noted that the present disclosure presents embodiments in the form of multi-gate transistors or fin-type multi-gate transistors referred to herein as Fin-FET devices. The FinFET devices may be GAA devices, nanosheet devices, Omega-gate (a-gate) devices, Pi-gate (H-gate) devices, dual-gate devices, tri-gate devices, bulk devices, silicon-on-insulator (SOI) devices, and/or other configurations. One of ordinary skill in the art may recognize other examples of semiconductor devices that may benefit from aspects of the present disclosure.

The term "nanosheet" refers to atomic, molecular or macromolecular particles typically having a thickness in a range of approximately 1 to 100 nanometers and a width greater than the thickness. For example, the width may be at least twice the thickness, but the disclosure is not limited thereto. Typically, the novel and differentiating properties and functions of nanosheet components are observed or developed at a critical length scale of typically under 100 nm. In some embodiments, "nanosheet" components can also be referred to as "nano-slab", "nano-ring" or "multi-bridge channel".

FIG. 1 shows a circuit diagram of a memory device according to aspects of the present disclosure. In some embodiments, the memory device 100 includes a plurality of SRAM cells, such as 6T-SRAM cells. As shown in FIG. 1, the memory device 100 includes a first SRAM cell C1 and a second SRAM cell C2. The first SRAM cell C1 includes two pull-up transistors PU11 and PU12, two pull-down transistors PD11 and PD12, and two pass-gate transistors PG11 and PG12. The second SRAM cell C2 includes two pull-up transistors PU21 and PU22, two pull-down transistors PD21 and PD22, and two pass-gate transistors PG21 and PG22. The memory device 100 includes a first inter transistor T1 and a second inter transistor T2 between the first SRAM cell C1 and the second SRAM cell C2.

The pull-up transistors PU11 and PU12 of the first SRAM cell C1, the pull-up transistors PU21 and PU22 of the second SRAM cell C2, the first inter transistor T1 and the second inter transistor T2 are of the same conductivity type. For example, the pull-up transistors PU11 and PU12 of the first SRAM cell C1, the pull-up transistors PU21 and PU22 of the second SRAM cell C2, the first inter transistor T1 and the second inter transistor T2 are p-type field effect transistor (pFET) devices. The pull-down transistors PD11 and PD12 of the first SRAM cell C1, the pass-gate transistors PG11 and PG12 of the first SRAM cell C1, the pull-down transistors PD21 and PD22 of the second SRAM cell C2, and the pass-gate transistors PG21 and PG22 of the second SRAM cell C2 are of the same conductivity type complementary to that of the pull-up transistors PU11, PU12, PU21 and PU22. For example, the pull-down transistors PD11 and PD12 of the first SRAM cell C1, the pass-gate transistors PG11 and PG12 of the first SRAM cell C1, the pull-down transistors PD21 and PD22 of the second SRAM cell C2, and the pass-gate transistors PG21 and PG22 of the second SRAM cell C2 are n-type field-effect transistor (nFET) devices.

The first inter transistor T1 and the second inter transistor T2 are electrically connected to the first SRAM cell C1 and the second SRAM cell C2. As shown in FIG. 1, the first inter transistor T1 and the second SRAM cell C2 are electrically connected to each other in series. The first inter transistor T1 is electrically connected to the first SRAM cell C1, and the second inter transistor T2 is electrically connected to the second SRAM cell. Further, a source/drain of the first inter transistor T1 is electrically connected to a source/drain of one of the pull-up transistors (e.g., PU12) and a source/drain of the second inter transistor T2, and the source/drain of the second inter transistor T2 is electrically connected to a source/drain of one of the pull-up transistors (e.g., PU21).

In some embodiments, the first and second inter transistors T1 and T2 may cause leakage current when the first SRAM cell C1 is in a "0" state and the second SRAM cell C2 is in a "1" state. However, the leakage current is less than approximately 10 pA, which is negligible to the entire memory device 100.

Figure 2:
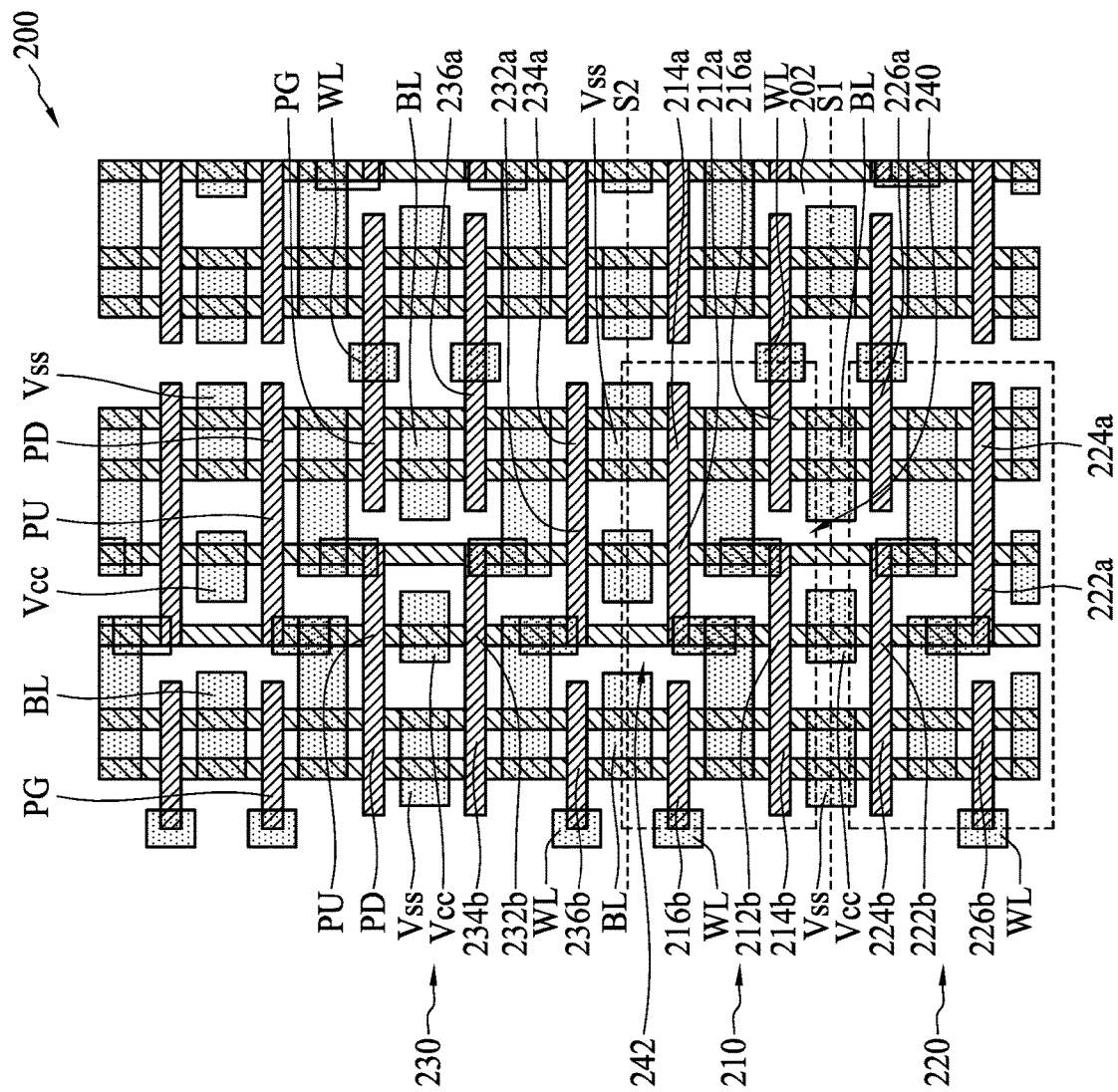
FIG. 2 shows a layout structure of a portion of a memory device according to aspects of the present disclosure.

FIG. 2 shows a layout structure of a portion of a memory device according to aspects of the present disclosure. In some embodiments, the layout structure may be used to form the memory device 100 mentioned above, but the disclosure is not limited thereto. In some embodiments, the memory device may be a multi-gate semiconductor memory device 200, and the multi-gate semiconductor memory device 200 may include the layout structure as shown in FIG. 2. In some embodiments, the memory device 200 is disposed over a substrate 402 (shown in FIGS. 4 and 5). The multi-gate semiconductor memory device 200 includes a first memory cell 210, a second memory cell 220 and a third memory cell 230 disposed over the substrate 402. The first memory cell 210 includes a plurality of first multi-gate FET devices, the second memory cell 220 includes a plurality of second multi-gate FET devices, and the third memory cell 230 includes a plurality of third multi-gate FET devices. For example, each of the first, second and third memory cells 210, 220 and 230 may include 6 multi-gate FET devices. In some embodiments, the first memory cell 210 may include two pull-up FET devices 212a and 212b, two pull-down FET devices 214a and 214b, and two pass-gate FET devices 216a and 216b. The two pull-up FET devices 212a and 212b are pFET devices, while the two pull-down FET devices 214a and 214b and the two pass-gate FET devices 216a and 216b are nFET devices. Similarly, the second memory cell 220 includes two pull-up FET devices 222a and 222b, two pull-down FET devices 224a and 224b, and two pass-gate FET devices 226a and 226b. The two pull-up FET devices 222a and 222b are pFET devices, while the two pull-down FET devices 224a and 224b and the two pass-gate FET devices 226a and 226b are nFET devices. The third memory cell 230 includes two pull-up FET devices 232a and 232b, two pull-down FET devices 234a and 234b, and two pass-gate FET devices 236a and 236b. The two pull-up FET devices 232a and 232b are pFET devices, while the two pull-down FET devices 234a and 234b and the two pass-gate FET devices 236a and 236b are nFET devices.

In some embodiments, a layout pattern of the first memory cell 210 and a layout pattern of the second memory cell 220 are line symmetrical about a first axis S1, and the layout pattern of the first memory cell 210 and a layout pattern of the third memory cell 230 are line symmetrical about a second axis S2. Further, the first axis S1 and the second axis S2 are parallel to each other, as shown in FIG. 2.

The multi-gate semiconductor memory device 200 further includes fin structures 240 and 242. The fin structure 240 is coupled to the first memory cell 210 and the second memory cell 220, and the fin structure 242 is coupled to the first memory cell 210 and the third memory cell 230, as shown in FIG. 2. In some embodiments, the fin structure 240 electrically connects one of the pull-up FET devices of the first memory cell 210, such as the pull-up FET device 212b, to one of the pull-up FET devices of the second memory cell 220, such as the pull-up FET device 222b. The fin structure 242 electrically connects the other pull-up FET device of the first memory cell 210, such as the pull-up FET device 212a, to one of the pull-up FET devices of the third memory cell 230, such as the pull-up FET device 232a. The fin structure 240 and the fin structure 242 are parallel to each other. Further, a length of the fin structure 240 and a length of the fin structure 242 are substantially the same.

In some embodiments, each of the fin structures 240 and 242 includes a plurality of first semiconductor layers and a plurality of second semiconductor layers (shown in FIG. 5), and the first semiconductor layers and the second semiconductor layers are alternately stacked over the substrate 402. The first semiconductor layer includes a first semiconductor material and a second semiconductor material, while the second semiconductor layer includes the second semiconductor material. A lattice constant of the first semiconductor material is different from a lattice constant of the second semiconductor material. In some embodiments, the lattice constant of the first semiconductor material is greater than the lattice constant of the second semiconductor material. In some embodiments, the first semiconductor material is germanium (Ge), and the second semiconductor material is silicon (Si), but the disclosure is not limited thereto. Accordingly, the first semiconductor layer includes SiGe, and the second semiconductor layer includes Si, but the disclosure is not limited thereto.

As mentioned above, all of the FET devices are multi-gate FET devices. In some embodiments, each of the p-type pull-up FET devices 212a, 212b, 222a, 222b, 232a and 232b includes the first semiconductor layer serving as a channel layer. Each of the n-type pull-down FET devices 214a, 214b, 224a, 224b, 234a and 234b includes the second semiconductor layer serving as a channel layer. Each of the pass-gate FET devices 216a, 216b, 226a, 226b, 236a and 236b includes the second semiconductor layer serving as a channel layer. Details of the channel layers will be described in the following description.

Figure 3:
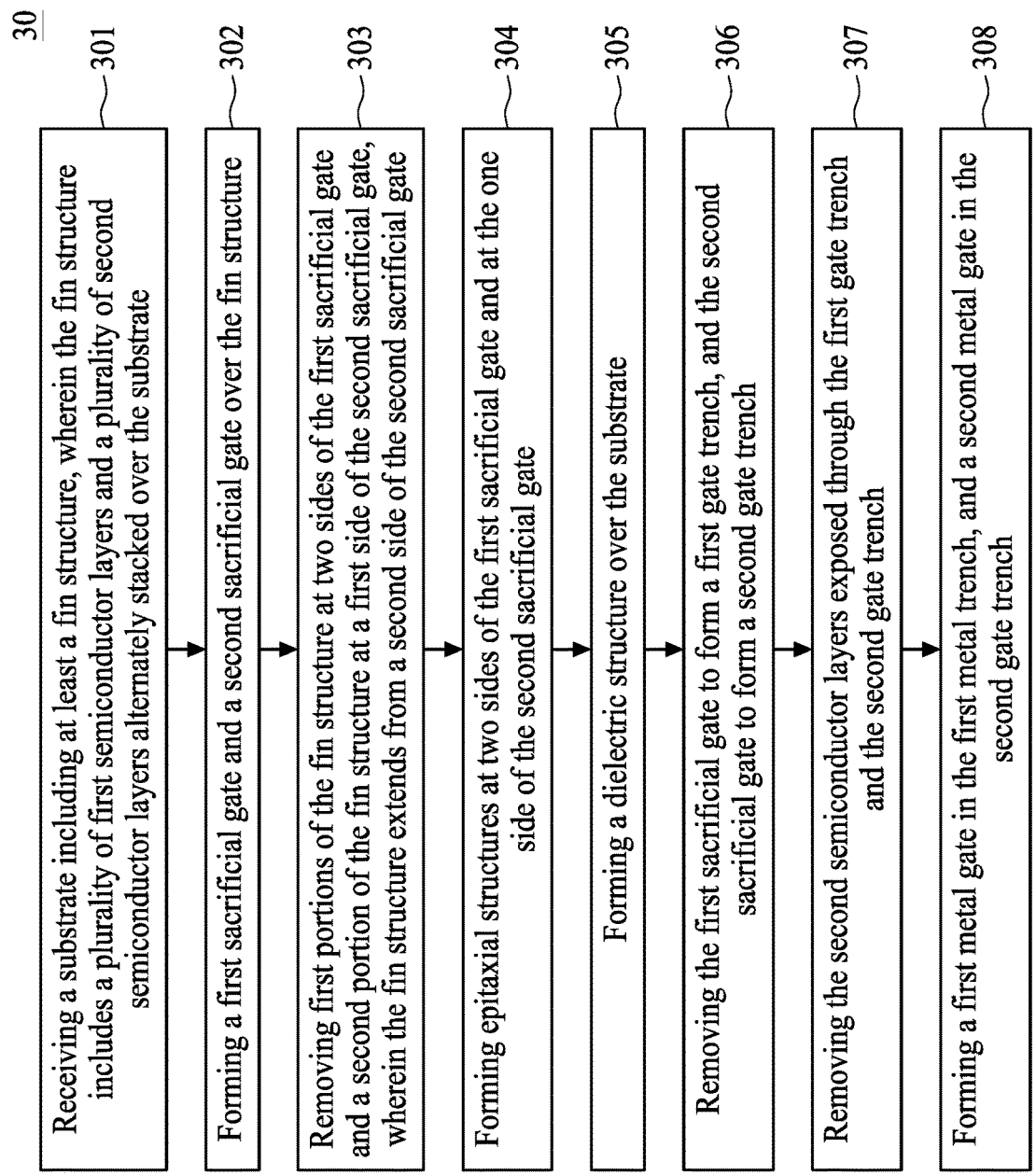
FIG. 3 shows a flow chart representing a method for forming a multi-gate semiconductor structure according to aspects of the present disclosure.

FIG. 3 is a flowchart representing a method for forming a multi-gate semiconductor structure 30 according to aspects of the present disclosure. The method 30 includes a number of operations (301, 302, 303, 304, 305, 306, 307 and 308). The method 30 will be further described according to one or more embodiments. It should be noted that the operations of the method 30 may be rearranged or otherwise modified within the scope of the various aspects. It should be further noted that additional processes may be provided before, during, and after the method 30, and that some other processes may just be briefly described herein. Thus, other implementations are possible within the scope of the various aspects described herein.

Figure 5:
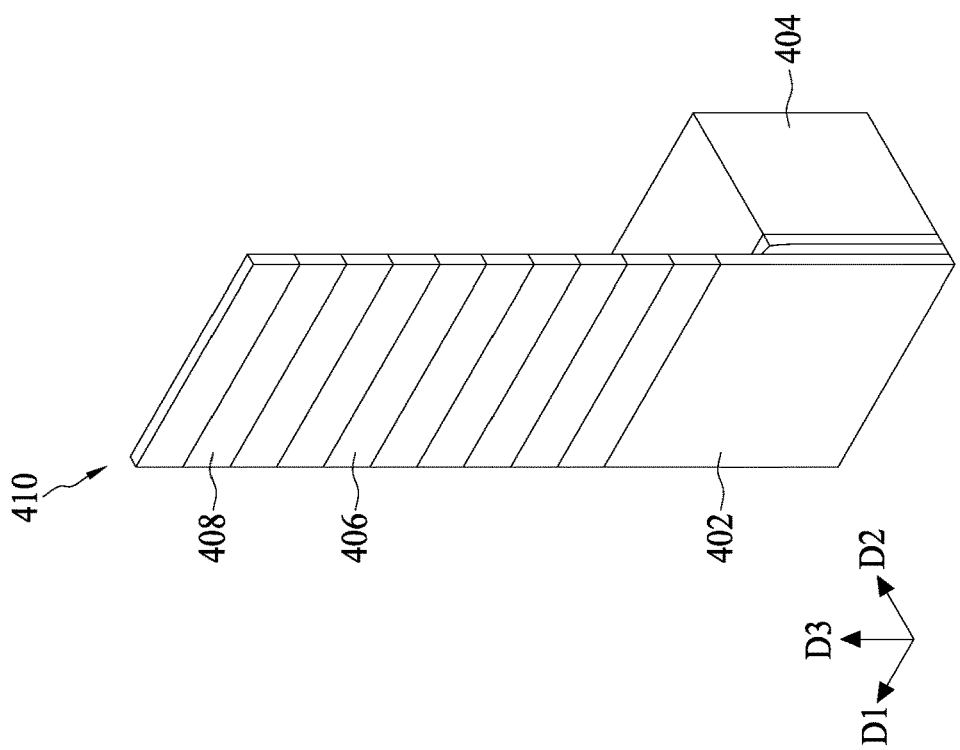
FIG. 5 is a cross-sectional view taken along line I-I' of FIG. 4.
Figure 7:
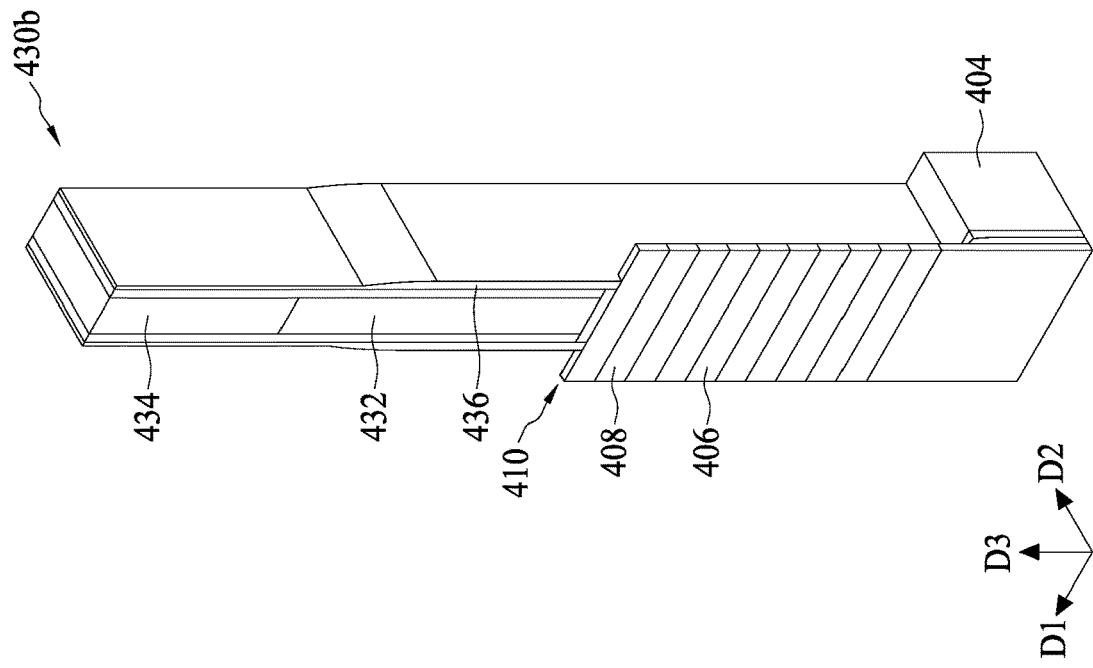
FIG. 7 is a cross-sectional view taken along line I-I' of FIG. 6.
Figures 8, 9A, 9B:
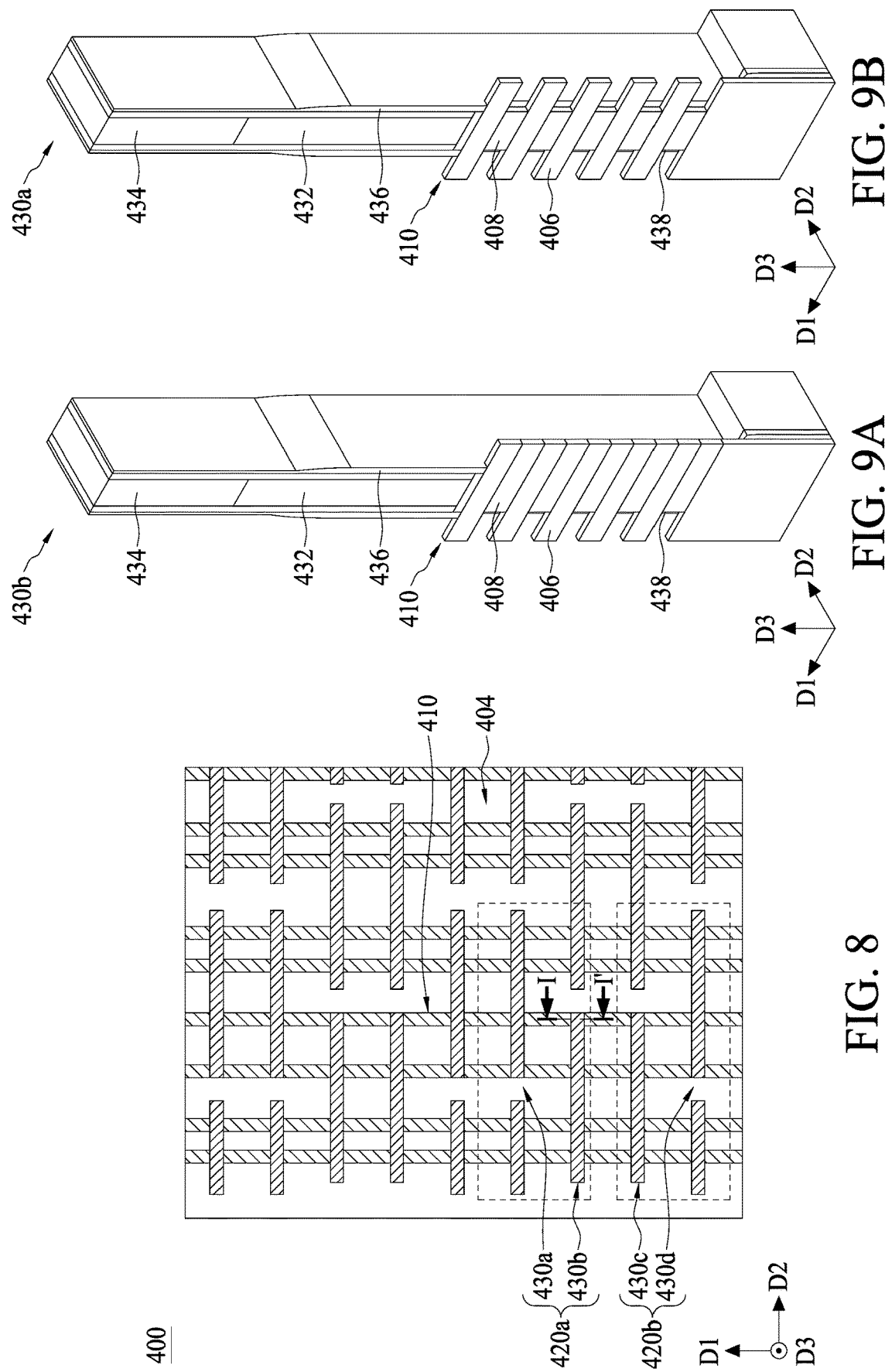
FIG. 9A is a cross-sectional view taken along line I-I' of FIG. 8.
FIG. 9B is cross-sectional view taken along line II-II' of FIG. 8.
Figure 10B:
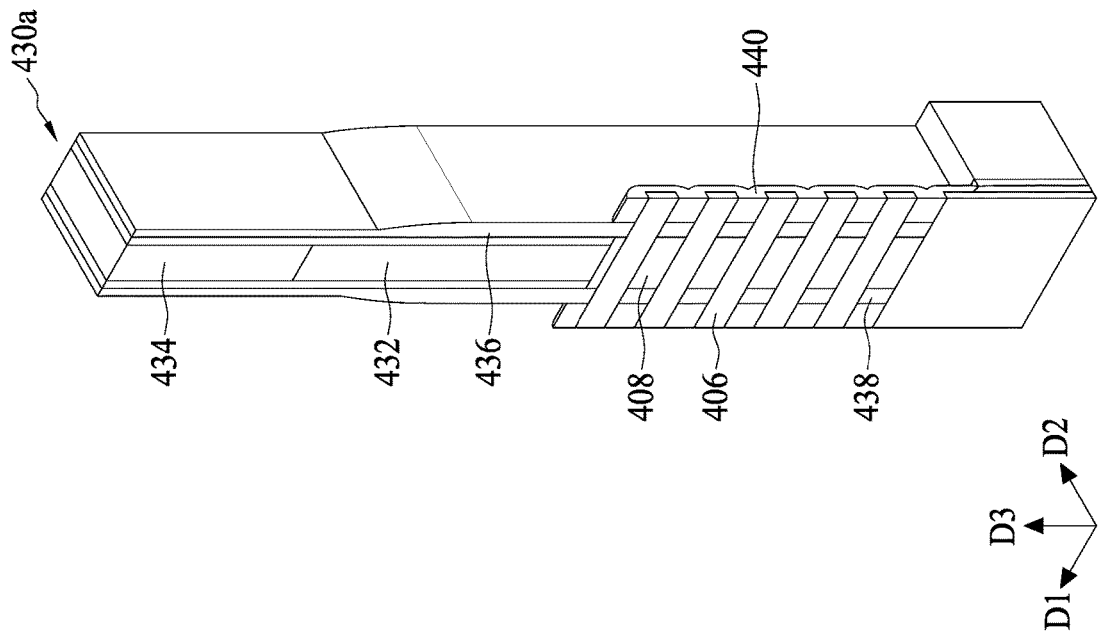
FIGS. 10A and 10B are cross-sectional views at fabrication stages subsequent to those of FIGS. 9A and 9B, respectively, according to aspects of one or more embodiments of the present disclosure.
Figure 10A:
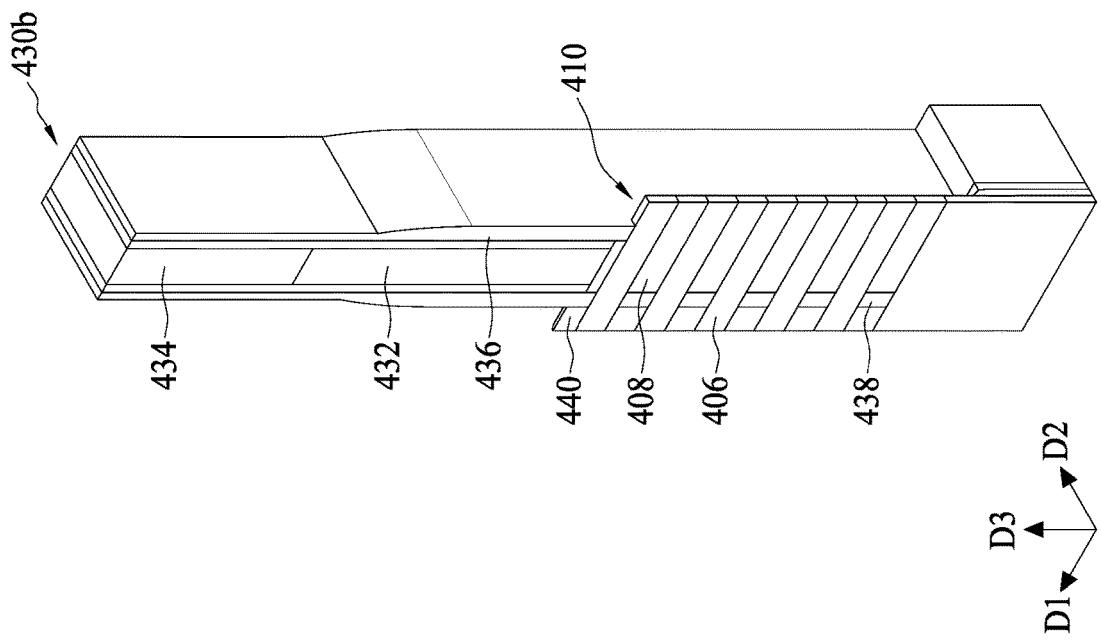
Figure 11B:
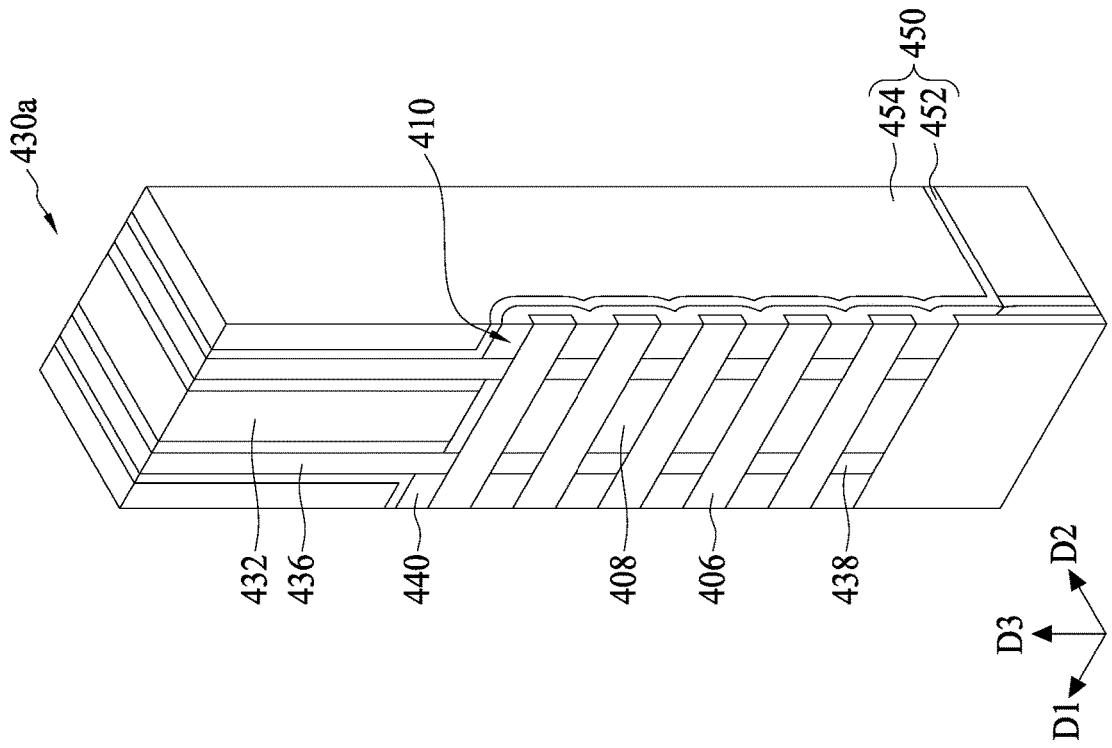
FIGS. 11A and 11B are cross-sectional views at fabrication stages subsequent to those of FIGS. 10A and 10B, respectively, according to aspects of one or more embodiments of the present disclosure.
Figure 11A:
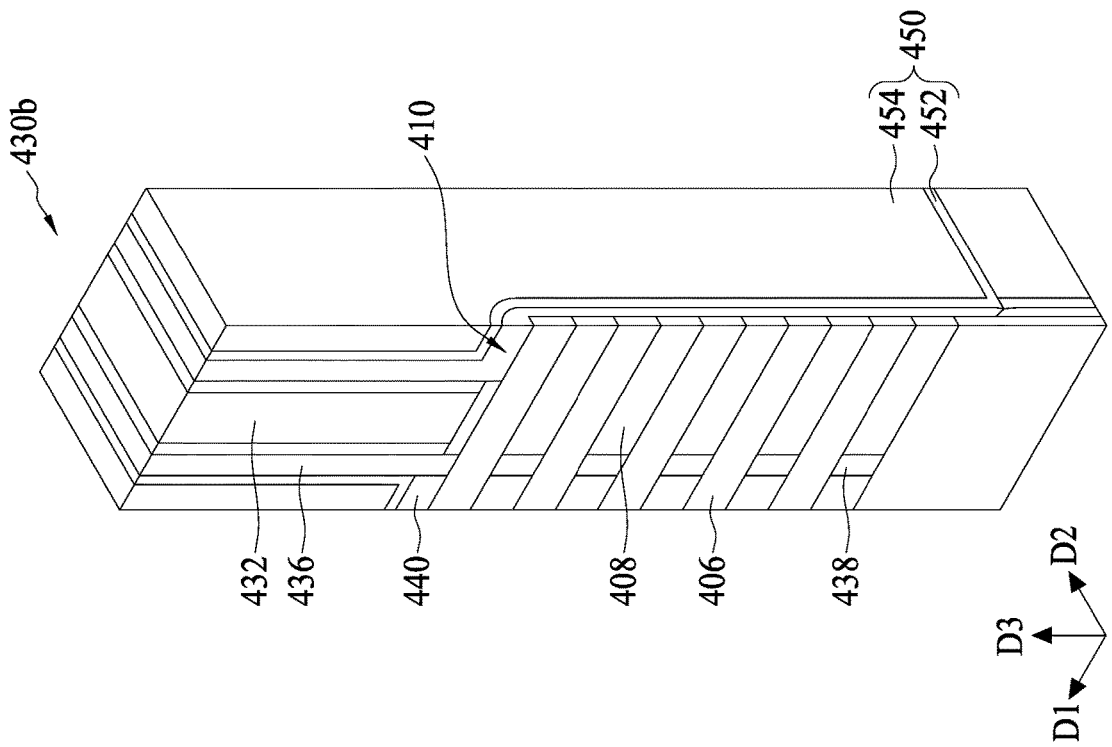
Figure 12B:
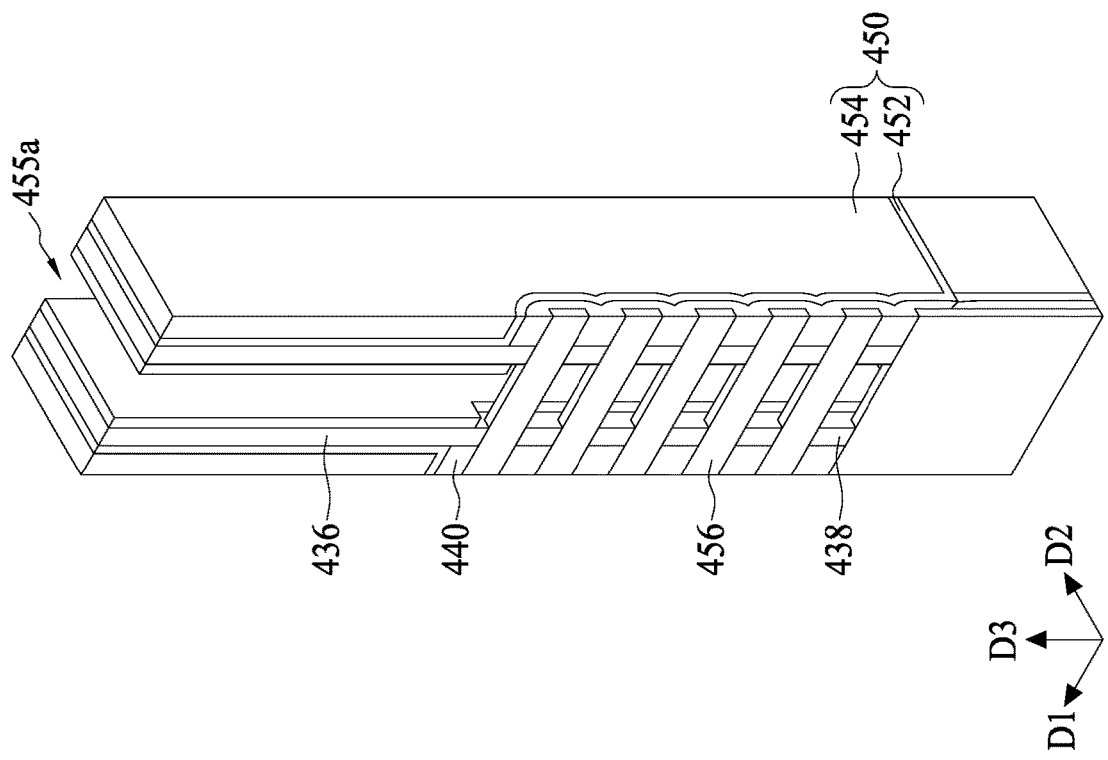
FIGS. 12A and 12B are cross-sectional views at fabrication stages subsequent to FIGS. 11A and 11B, respectively, according to aspects of one or more embodiments of the present disclosure.
Figure 12A:
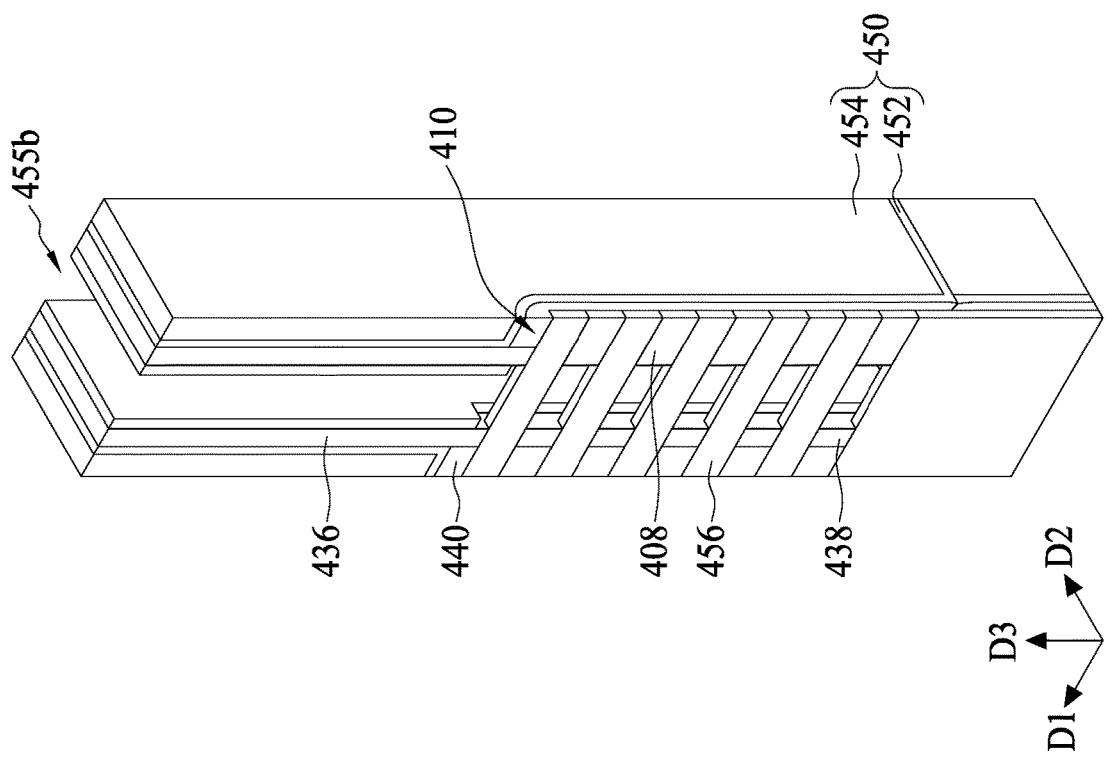
Figure 13A:
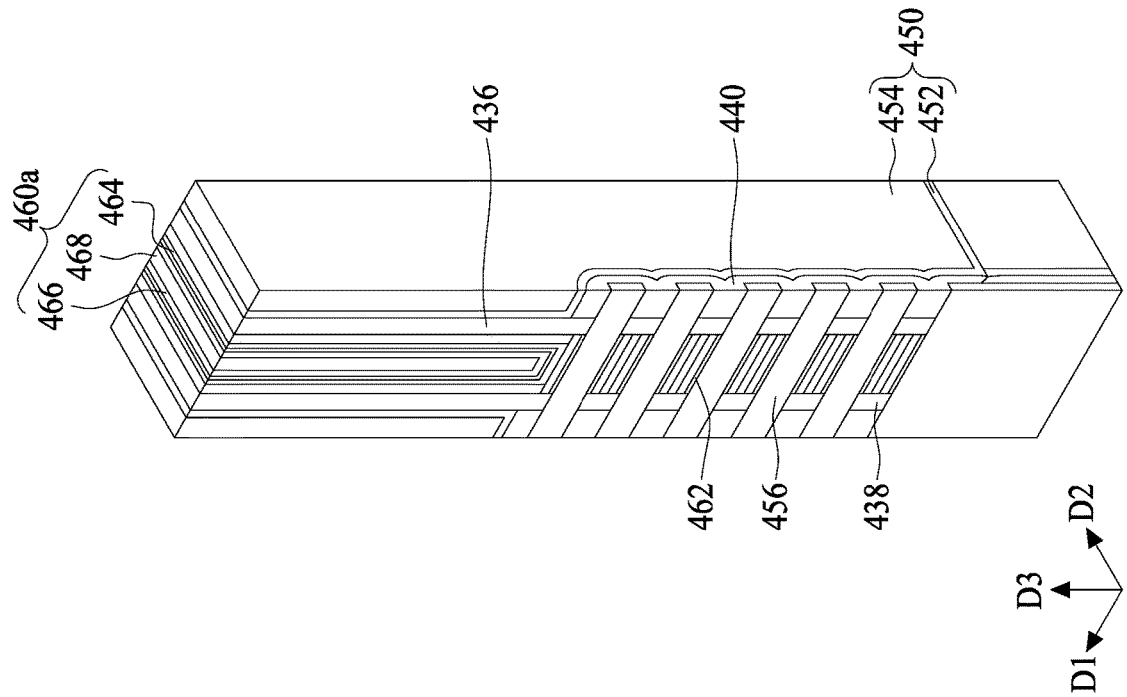
FIGS. 13A and 13B are cross-sectional views at fabrication stages subsequent to those of FIGS. 12A and 12B, respectively.
Figure 13B:
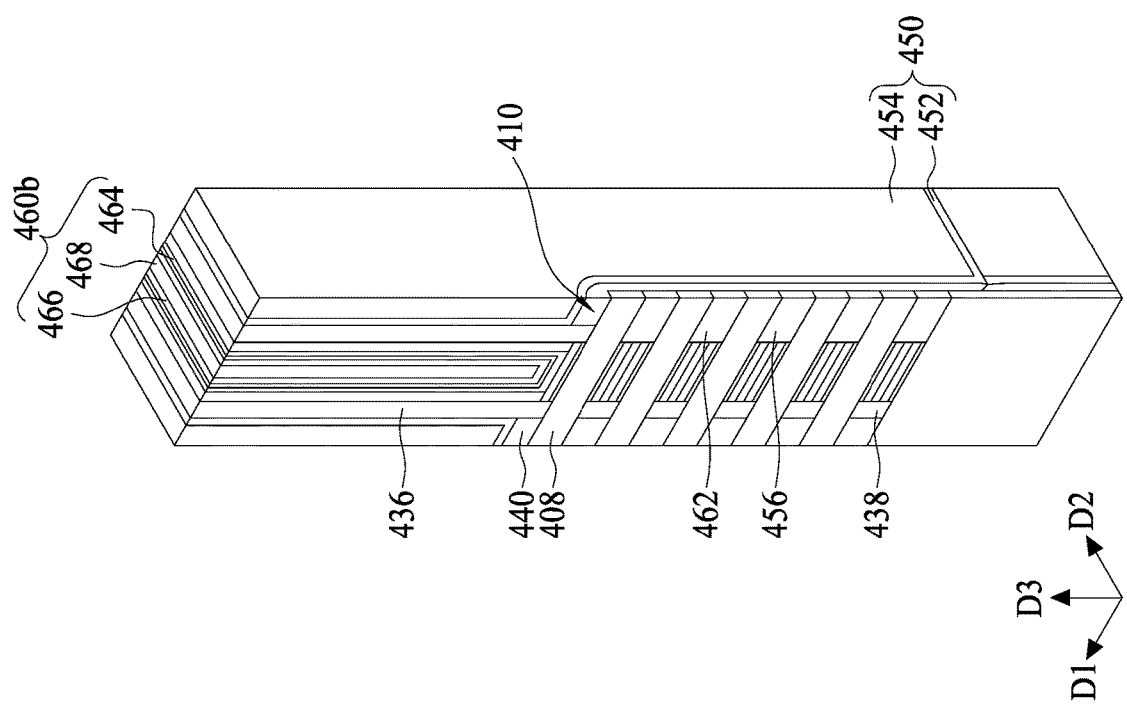
Figure 14:
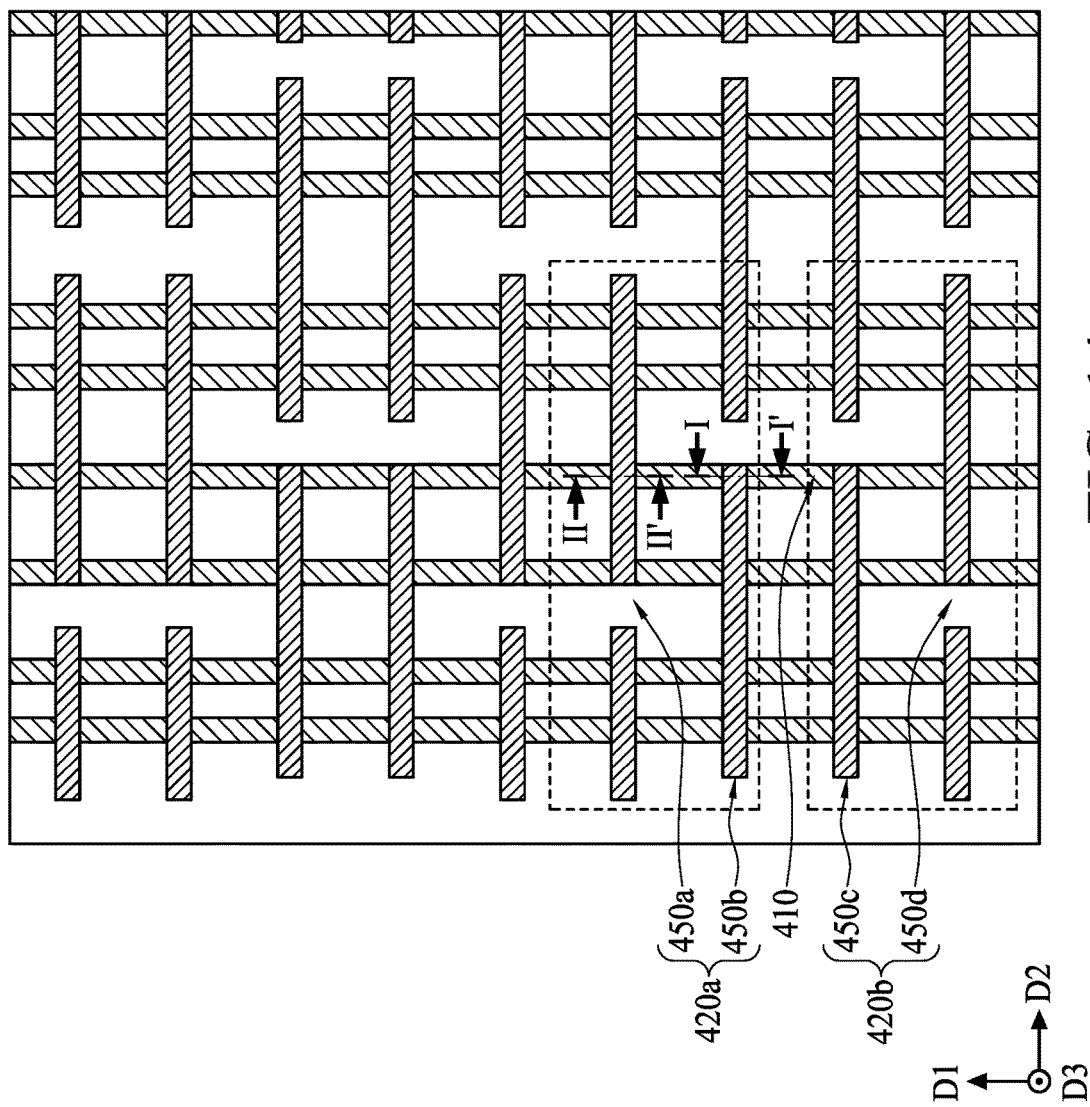

FIGS. 4, 6, 8 and 14 respectively illustrate a layout structure of a multi-gate semiconductor device at various fabrication stages constructed according to aspects of one or more embodiments of the present disclosure. FIG. 5 is a cross-sectional view taken along line I-I' of FIG. 4. FIG. 7 is a cross-sectional view taken along line I-I' of FIG. 6. FIG. 9A is a cross-sectional view taken along line I-I' of FIG. 8, and FIG. 9B is a cross-sectional view taken along line II-II' of FIG. 8. FIGS. 10A and 10B are cross-sectional views at fabrication stages subsequent to those of FIGS. 9A and 9B, respectively, according to aspects of one or more embodiments of the present disclosure. FIGS. 11A and 11B are cross-sectional views at fabrication stages subsequent to those of FIGS. 10A and 10B, respectively, according to aspects of one or more embodiments of the present disclosure. FIGS. 12A and 12B are cross-sectional views at fabrication stages subsequent to those of FIGS. 11A and 11B, respectively, according to aspects of one or more embodiments of the present disclosure. FIGS. 13A and 13B are cross-sectional views at fabrication stages subsequent to those of FIGS. 12A and 12B, respectively, according to aspects of one or more embodiments of the present disclosure. FIG. 13A is also a cross-sectional view taken along line I-I' of FIG. 14, and FIG. 13B is also a cross-sectional view taken along line II-II' of FIG. 14.

Figure 4:
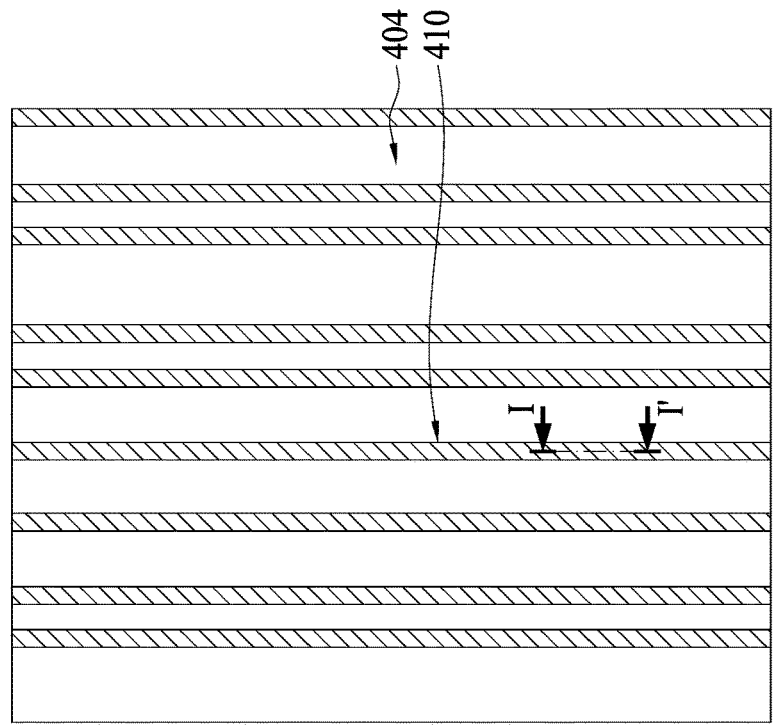
FIGS. 4, 6, 8, and 14 illustrate a layout structure of a multi-gate semiconductor device at various fabrication stages constructed according to aspects of one or more embodiments of the present disclosure.

In some embodiments, referring to FIGS. 4 and 5, in operation 301, a substrate 402 including at least a fin structure 410 is received. In some embodiments, the substrate 402 may be a semiconductor substrate such as a silicon substrate. The substrate 402 may also include other semiconductors such as germanium (Ge), silicon carbide (SiC), silicon germanium (SiGe) or diamond. Alternatively, the substrate 402 may include a compound semiconductor and/or an alloy semiconductor. The substrate 402 may include various layers, including conductive or insulating layers formed on a semiconductor substrate. The substrate 402 may include various doping configurations depending on design requirements as is known in the art. For example, different doping profiles (e.g., n wells, p wells) may be formed on the substrate 402 in regions designed for different device types (e.g., n-type field-effect transistors (nFET), or p-type field-effect transistors (pFET)). A suitable doping may include ion implantation of dopants and/or diffusion processes. The substrate 402 typically has isolation features (e.g., shallow trench isolation (STI) features) 404 interposing the regions, thereby providing different device types. Further, the substrate 402 may optionally include an epitaxial layer (epi-layer), may be strained for performance enhancement, may include an SOI structure, and/or may have other suitable enhancement features. A stack including semiconductor layers is formed over the substrate 402. In some embodiments, a strain relaxed buffer (SRB) layer (not shown) can be formed over the substrate 402. The SRB layer may be different in composition from the substrate 402 in order to create lattice strain at the interface with the substrate 402. For example, in some embodiments, the substrate 402 includes silicon and is substantially free of germanium while the SRB layer includes SiGe.

Still referring to FIGS. 4 and 5, a stack including first and second semiconductor layers is formed over the substrate 402. In embodiments that include an SRB layer disposed on the substrate 402, the stack of the first and second semiconductor layers may be disposed on the SRB layer. The stack of the first and second semiconductor layers may include alternating layers of different compositions. For example, in some embodiments, the stack includes first semiconductor layers 406 of a first composition alternating with second semiconductor layers 408 of a second composition. By way of example, growth of the layers of the stack may be performed by a molecular beam epitaxy (MBE) process, a metal-organic chemical vapor deposition (MOCVD) process, and/or other suitable epitaxial growth processes. Although five first semiconductor layers 406 and five second semiconductor layers 408 are shown, it should be understood that the stack may include any number of layers of any suitable composition with various examples including between 2 and 10 first semiconductor layers 406 and between 2 and 10 second semiconductor layers 408. As explained below, the different compositions of the layers in the stack (e.g., first semiconductor layers 406 and second semiconductor layers 408) may be used to selectively process some of the layers. Accordingly, the compositions may have different oxidation rates, etchant sensitivity and/or other differing properties. The first and second semiconductor layers 406 and 408 may have thicknesses chosen based on device performance considerations. In some embodiments, the first semiconductor layers 406 are substantially uniform in thickness, and the second semiconductor layers 408 are substantially uniform in thickness, but the disclosure is not limited thereto.

As mentioned above, the first semiconductor layers 406 may include the first semiconductor material and the second semiconductor material, while the second semiconductor layer 408 includes the second semiconductor material. A lattice constant of the first semiconductor material is different from a lattice constant of the second semiconductor material. For example, the lattice constant of the first semiconductor material is greater than the lattice constant of the second semiconductor material. In some embodiments, the first semiconductor material is germanium and the second semiconductor material is silicon. In such embodiments, the first semiconductor layers 406 may include SiGe, but the disclosure is not limited thereto. Additionally, Ge concentration in the first semiconductor layers 406 may be less than or equal to approximately 50%, but the disclosure is not limited thereto. In other embodiments, the first semiconductor layers 406 may include other materials such as a compound semiconductor such as SiC, gallium arsenide (GaAs), gallium phosphide (GaP), indium phosphide (InP), indium arsenide (InAs) and/or indium antimonide (InSb), an alloy semiconductor such as SiGe, GaAsP, AlInAs, AlGaAs, InGaAs, GaInP and/or GaInAsP, or combinations thereof. In some embodiments, the semiconductor layers 406 and 408 may be undoped or substantially dopant-free, where, for example, no doping is performed during the epitaxial growth process. Alternatively, the first and second semiconductor layers 406 and 408 may be doped. For example, the semiconductor layers 406 and 408 may be doped with a p-type dopant such as boron (B), aluminum (Al), In or Ga for forming a p-type channel, or doped with an n-type dopant such as P, As or Sb for forming an n-type channel.

Still referring to FIGS. 4 and 5, the fin structure 410 are formed over the substrate 402 from the stack of first and second semiconductor layers 406 and 408. The fin structures 410 may be fabricated using suitable operations including photolithography and etch operations. In some embodiments, forming the fin structure 410 may further include a trim process to decrease a width and/or a height of the fin structure 410. The trim process may include wet or dry etching processes. The height and the width of the fin structure 410 may be chosen based on device performance considerations. Further, the fin structure 410 may extend in a first direction D1 as shown in FIGS. 4 and 5.

Additionally, a liner (not shown) may be formed over the fin structure 410 and the substrate 402.

Figure 6:
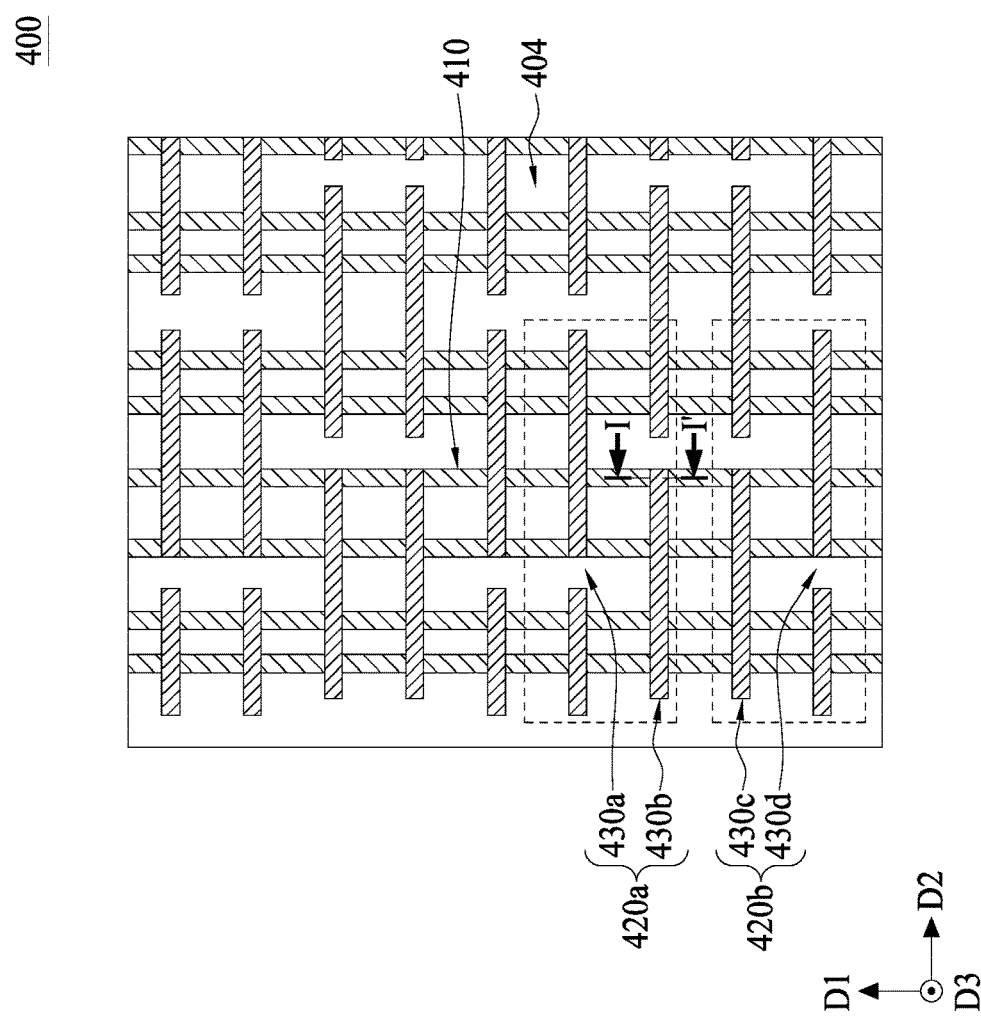

Referring to FIGS. 6 and 7, a plurality of sacrificial gates are formed over the fin structure 410. In some embodiments, in operation 302, at least two sacrificial gates are formed over the fin structure 410. In some embodiments, sacrificial gates 430a and 430b of a first cell 420a are formed over the fin structure 410, and sacrificial gates 430c and 430d of a second cell 420b are formed over the same fin structure 410. In some embodiments, the first cell 420a and the second cell 420b may be memory cells as mentioned above. Further, the first cell 420a and the second cell 420b may be SRAM memory cells. The sacrificial gates 430a to 430d may be replaced at a later processing stage by a high-k dielectric layer (HK) and metal gate electrode (MG) as discussed below. In some embodiments, the sacrificial gates 430a to 430d are formed over the substrate 402, and extend along a second direction D2, which is not parallel to the first direction D1. Additionally, the first direction D1 and the second direction D2 are in a same plane. Each of the sacrificial gates 430a to 430d is at least partially disposed over the fin structure 410, and portions of the fin structure 410 underlying the sacrificial gates 430a to 430d may be referred to as channel regions. Each of the sacrificial gates 430a to 430d may also define a source/drain region of the fin structures 410, for example, as portions of the fin structure 410 adjacent to and on opposing sides of the channel region. In some embodiments, the sacrificial gates 430a to 430d can include at least a polysilicon layer 432 and a patterned hard mask 434 for defining the sacrificial gates.

In some embodiments, the sacrificial gate 430b of the first cell 420a is adjacent to the sacrificial gate 430c of the second cell 420b, but the disclosure is not limited thereto. It should be noted that the sacrificial gate 430b and the sacrificial gate 430c belong to two different cells 420a and 420b. In comparative approaches, a portion of the fin structure between the two cells 420a and 420b, such as the portion of the fin structure 410 between the sacrificial gate 430b and the sacrificial gate 430c, is removed to separate the two cells 420a and 420b. In such comparative approaches, a fin-cut operation may be performed prior to the forming of the sacrificial gates. Further, a photomask including the pattern for removing such portion and a patterning operation are required. Such operations incur increased cost. Consequently, end edges may be formed between the segmented fin structure, and the sacrificial gate over the end edges is referred to as a polysilicon over diffusion edge (PODE). In contrast to the comparative approaches, the fin-cut operation is unrequired. Accordingly, the portion of the fin structure 410 between the sacrificial gate 430b and the sacrificial gate 430c remains as shown in FIG. 6. In such embodiments, there is no PODE observed in the layout structure of the multi-gate semiconductor device.

Still referring to FIGS. 6 and 7, in some embodiments, a spacer 436 is formed over sidewalls of each sacrificial gate 430a to 430d. In some embodiments, the spacer 436 includes insulating materials. As shown in FIG. 7, the sidewalls of each sacrificial gate 430a to 430d are covered by the spacer 436. In some embodiments, portions of the liner can be removed during or after the forming of the spacer 436, and thus portions of the fin structures 410 are exposed.

In operation 303, portions of the fin structure 410 at two sides of the sacrificial gate 430a and the spacer 438 are removed as shown in FIG. 9B, and a portion of the fin structure 410 at only one side of the sacrificial gate 430b is removed as shown in FIG. 9A. In some embodiments, portions of the fin structures 410 at two sides of the sacrificial gate 430d are also removed, and a portion of the fin structure 410 on one side of the sacrificial gate 430c is removed. In some embodiments, the portion of the fin structure 410 on the side of the sacrificial gate 430b facing the sacrificial gate 430a is removed. Additionally, the portion of the fin structure 410 on the side of the sacrificial gate 430c facing the sacrificial gate 430d is removed. Accordingly, a portion of the fin structure 410 on another side of the sacrificial gate 430b (i.e., the side opposite to the sacrificial gate 430a) remains on the substrate 402. In other words, the fin structure 410 extends from the sacrificial gate 430b in the second direction D2. Similarly, a portion of the fin structure 410 on another side of the sacrificial gate 430c (i.e., the side opposite to the sacrificial gate 430d) remains on the substrate 402. In some embodiments, such portion of the fin structure couples the sacrificial gate 430b and the sacrificial gate 430c.

In some embodiments, a portion of each of the exposed second semiconductor layers 408 is removed and thus a plurality of notches (not shown) are formed. In some embodiments, an insulating layer (not shown) is formed over the substrate 402 and a suitable etching operation is then performed. Thus, a plurality of inner spacers 438 are formed in the notches as shown in FIGS. 9A and 9B. In some embodiments, the inner spacers 438 include one or more insulating materials such as SiN, SiO, SiC, SiOC, SiOCN, other materials, or a combination thereof, but the disclosure is not limited thereto. In such embodiments, the second semiconductor layers 408 of the sacrificial gates 430a and 430d are enclosed by the first semiconductor layers 406 and the inner spacers 438, as shown in FIG. 9B. It should be noted that the inner spacers 438 are formed on only one side of the sacrificial gates 430b and 430c, as shown in FIG. 9A.

Referring to FIGS. 10A and 10B, in operation 304, epitaxial structures 440 are formed at two sides of the sacrificial gate 430a and at one side of the sacrificial gate 430b. In some embodiments, epitaxial structures 440 are also formed at two sides of the sacrificial gate 430d and at one side of the sacrificial gate 430c. In other words, one side of the sacrificial gate 430b includes the epitaxial structure 440, and the other side of the sacrificial gate 430b includes the fin structure 410, as shown in FIG. 10A. The epitaxial structure 440 is formed to surround the exposed portion of the first semiconductor layer 406. In some embodiments, the epitaxial structure 440 includes the first semiconductor material and the second semiconductor material. For example but not limited thereto, the epitaxial structure 440 can include SiGe, wherein a Ge concentration of the epitaxial structure 440 is greater than a Ge concentration of the plurality of first semiconductor layers 406. In some embodiments, the Ge concentration of the epitaxial structure 440 is greater than 50%, but the disclosure is not limited thereto. In some embodiments, the Ge concentration of the epitaxial structure 440 is between approximately 50% and approximately 70%, but the disclosure is not limited thereto. In some embodiments, the epitaxial structure 440 is a doped epitaxial semiconductor layer. For example but not limited thereto, the epitaxial structure 440 can be a boron-doped silicon germanium (SiGeB) epitaxial layer. The epitaxial structure 440 serves as a source/drain.

Referring to FIGS. 11A and 11B, in operation 305, a dielectric structure 450 is disposed over the substrate 402. In some embodiments, the dielectric structure 450 can include an etch-stop layer (e.g., a contact etch stop layer (CESL)) 452 and various dielectric layers (e.g., an inter-layer dielectric (ILD) layer) 454 formed on the substrate 402. In some embodiments, the CESL 452 includes a SiN layer, a SiCN layer, a SiON layer and/or other materials known in the art. In some embodiments, the ILD layer 454 includes materials such as tetraethylorthosilicate (TEOS) oxide, un-doped silicate glass, or doped silicon oxide such as borophosphosilicate glass (BPSG), fused silica glass (FSG), phosphosilicate glass (PSG), boron doped silicon glass (BSG), and/or other suitable dielectric materials. In some embodiments, after the CESL 452 and the ILD layer 454 are deposited, a planarization process, such as a chemical mechanical planarization (CMP) operation, may be performed to form the dielectric structure 450 and to expose a top surface of the sacrificial gates 430a and 430b (and the sacrificial gates 430c and 430d) as shown in FIGS. 11A and 11B. In some embodiments, the planarization is performed to expose at least a top surface of the polysilicon layer 432 of the sacrificial gates 430a and 430b (and the sacrificial gates 430c and 430d).

Referring to FIGS. 12A and 12B, the sacrificial gates 430a and 430b (and the sacrificial gates 430c and 430d) are removed in operation 306. Accordingly, gate trenches 455a and 455b are formed as shown in FIGS. 12A and 12B. In some embodiments, the spacer 436 may be exposed through sidewalls of the gate trenches 455a and 455b. Further, the fin structure 410 is exposed through the gate trenches 455a and 455b.

In some comparative approaches, over-etching for forming the notches may damage the liner layer. Such damage is exacerbated on PODE when an overlay issue arises, and thus a pit may cause undesired consumption during the removing of the sacrificial gates of the PODE. In contrast to such comparative approaches as mentioned above, no PODE is formed in the method of the present disclosure, and therefore such consumption is mitigated.

Still referring to FIGS. 12A and 12B, in operation 307, the liner layer disposed over the fin structure 410 is removed, and the second semiconductor layers 408 are removed. Accordingly, a plurality of nanowires 456, which previously comprised the first semiconductor layers 406, are formed in the gate trenches 455a and 455b. The nanowires 456 serving as channel regions are suspended in the gate trenches 455a and 455b. In some embodiments, the nanowires 456 can be slightly etched to obtain various desirable dimensions and shapes, and the various desired dimensions and shapes may be chosen based on device performance considerations. As shown in FIG. 12A, the inner spacers 438 are exposed through one side of the gate trench 455b, while the second semiconductor layer 408 may be exposed through the other side of the gate trench 455b. As shown in FIG. 12B, the inner spacers 438 are exposed through two sides of the gate trench 455a.

Referring to FIGS. 13A and 13B, in operation 308, a metal gate 460a is formed in the gate trench 455a, and a metal gate 460b is formed in the gate trench 455b. In some embodiments, an interfacial layer (IL) 462 is formed to surround each of the nanowires 456 exposed in the gate trenches 455a and 455b to wrap each of the nanowires 456. In some embodiments, the IL 462 may include an oxide-containing material such as SiO or SiON. After the forming of the IL 462, a gate dielectric layer 464 is formed over the IL 462. The gate dielectric layer 464 surrounds each of the nanowires 456. In some embodiments, the gate dielectric layer 464 includes a high-k dielectric material having a high dielectric constant, for example, a dielectric constant greater than that of thermal silicon oxide (~3.9). The high-k dielectric material may include hafnium oxide ($HfO_2$), zirconium oxide ($ZrO_2$), lanthanum oxide ($La_2O_3$), aluminum oxide ($Al_2O_3$), titanium oxide ($TiO_2$), yttrium oxide ($Y_2O_3$), strontium titanate ($SrTiO_3$), hafnium oxynitride ($HfO_xN_y$), other suitable metal-oxides, or combinations thereof.

Still referring to FIGS. 13A and 13B, after the forming of the gate dielectric layer 464, a gate conductive layer 466 is disposed in the gate trenches 455a and 455b. In some embodiments, the gate conductive layer 466 is formed for a p-channel FET, but the disclosure is not limited thereto. In some embodiments, the gate conductive layer 464 can include at least a barrier metal layer (not shown) and a work function layer. The barrier metal layer can include, for example but not limited thereto, TiN. The work function metal layer, which provides proper work function to the p-channel FET, includes one or more of TiAlC, Al, TiAl, TaN, TaAlC, TiN, TiC and Co, but the disclosure is not limited thereto. Next, a gap-filling metal layer 468 is formed to fill the gate trenches 455a and 455b. The gap-filling metal layer 468 can include conductive material, such as Al, Cu, AlCu, or W, but is not limited to the above-mentioned materials. Accordingly, the metal gate 460a is formed in the gate trench 455a, and the metal gate 460b is formed in the gate trench 455b, as shown in FIGS. 13A and 13B.

Referring to FIG. 14, the above-mentioned operations are performed to form a metal gate 450c replacing the sacrificial gate 430c and a metal gate 450d replacing the sacrificial gate 430d. Consequently, a multi-gate semiconductor device 400 is obtained. In some embodiments, the metal gates 450a and 450b belong to the first cell 420a, while the metal gates 450c and 450d belong to the second cell 420b. It should be noted that the fin structure 410 couples the metal gate 450b of the first cell 420a and the metal gate 450c of the second cell 420b.

According to one embodiment of the present disclosure, a multi-gate semiconductor structure is provided. The multi-gate semiconductor structure may be used to form memory cells (i.e., SRAM cells). The multi-gate semiconductor structure is free of PODE, therefore, operations and photomask for a fin cut are unnecessary. The SRAM cells formed by the multi-gate semiconductor structure may include two inter transistors disposed between the two memory cells, and a leakage current caused by the two inter transistors is negligibly small.

According to one embodiment of the present disclosure, a memory device is provided. The memory device includes a first SRAM cell, a second SRAM cell, a first inter transistor and a second inter transistor. The first SRAM cell includes two first pull-up transistors, two first pull-down transistors and two first pass-gate transistors. The second SRAM cell includes two second pull-up transistors, two second pull-down transistors, and two second pass-gate transistors. The first inter transistor and the second inter transistors are electrically connected to the first SRAM cell and the second SRAM cell.

According to one embodiment of the present disclosure, a multi-gate semiconductor device is provided. The multi-gate semiconductor device includes a first memory cell, a second memory cell, a third memory cell, a first fin structure and a second fin structure. The first memory cell includes a plurality of first multi-gate devices. The second memory cell includes a plurality of second multi-gate devices. The third memory cell includes a plurality of third multi-gate devices. The first fin structure is coupled to the first memory cell and the second memory cell, and the second fin structure is coupled to the first memory cell and the third memory cell.

According to one embodiment of the present disclosure, a method for forming a multi-gate semiconductor device is provided. The method includes the following operations. A substrate including at least a fin structure is received. The fin structure includes a plurality of first semiconductor layers and a plurality of second semiconductor layers alternately stacked over the substrate. A first sacrificial gate and a second sacrificial gate are disposed over the fin structure. First portions of the fin structure at two sides of the first sacrificial gate and a second portion of the fin structure at a first side of the second sacrificial gate are removed. The fin structure extends from a second side of the second sacrificial gate. Epitaxial structures are formed at two sides of the first sacrificial gate and the first side of the second sacrificial gate. A dielectric structure is disposed over the substrate. The first sacrificial gate and the second sacrificial gate are removed to form a first gate trench and a second gate trench. The second semiconductor layers exposed through the first gate trench and the second gate trench are removed. A first metal gate is formed in the first gate trench, and a second metal gate is formed in the second gate trench.

The foregoing outlines features of several embodiments so that those skilled in the art may better understand the aspects of the present disclosure. Those skilled in the art should appreciate that they may readily use the present disclosure as a basis for designing or modifying other processes and structures for carrying out the same purposes and/or achieving the same advantages of the embodiments introduced herein. Those skilled in the art should also realize that such equivalent constructions do not depart from the spirit and scope of the present disclosure, and that they may make various changes, substitutions, and alterations herein without departing from the spirit and scope of the present disclosure.

What is claimed is:

1. A memory device comprising:
 a first static random access memory (SRAM) cell comprising:
  a first pull-up transistor and a second pull-up transistor;
  a first pull-down transistor and a second pull-down transistor; and
  a first pass-gate transistor and a second pass-gate transistor;
 a second SRAM cell comprising:
  a third pull-up transistor and a fourth pull-up transistor;
  a third pull-down transistor and a fourth pull-down transistor; and
  a third pass-gate transistor and a fourth pass-gate transistor;

a first inter transistor and a second inter transistor electrically connected to the first SRAM cell and the second SRAM cell;
a first bit line coupled to the first pass-gate transistor of the first SRAM cell;
a second bit line coupled to the fourth pass-gate transistor of the second SRAM cell; and
a third bit line coupled to the second pass-gate transistor of the first SRAM and the third pass-gate transistor of the second SRAM,
wherein a source/drain of the first inter transistor is electrically connected to a source/drain of the second pull-up transistor of the first SRAM cell and a source/drain of the second pass-gate transistor of the first SRAM cell, and a source/drain of the second inter transistor is electrically connected to a source/drain of the third pull-up transistor of the second SRAM cell and a source/drain of the third pass-gate transistor of the second SRAM cell.

2. The memory device of claim 1, wherein the first inter transistor and the second inter transistor are electrically connected in series.

3. The memory device of claim 2, wherein the first inter transistor is electrically connected to a source/drain of the second pull-down transistor of the first SRAM cell, and the second inter transistor is electrically connected to a source drain of the third pull-down transistor of the second SRAM.

4. The memory device of claim 1, wherein the inter transistors are p-type field-effect transistor (pFET) devices.

5. The memory device of claim 1, wherein the first pull-up transistor and the second pull-up transistor of the first SRAM cell and the third pull-up transistor and the fourth pull-up transistor of the second SRAM cell are pFET devices.

6. The memory device of claim 1, wherein the first pull-down transistor and the second pull-down transistor of the first SRAM cell and the third pull-down transistor and the fourth transistor of the second SRAM cell are n-type field-effect transistor (nFET) devices.

7. The memory device of claim 1, wherein the first pass-gate transistor and the second pass-gate transistor of the first SRAM cell and the third pass-gate transistor and the fourth pass-gate transistor of the second SRAM cell are nFET devices.

8. The memory device of claim 1, wherein the source/drain of the first inter transistor is electrically connected to the source/drain of the second pull-up transistor of the first SRAM cell and the source/drain of the second inter transistor in series, and the source/drain of the second inter transistor is electrically connected to the source/drain of the third pull-up transistor of the second SRAM in series.

9. A multi-gate semiconductor device for memory comprising:
a first memory cell comprising a plurality of first multi-gate FET devices, wherein the plurality of first multi-gate FET devices comprises at least a first pass-gate transistor, a second pass-gate transistor, a first pull-up transistor and a second pull-up transistor;
a second memory cell comprising a plurality of second multi-gate FET devices, wherein the plurality of second multi-gate FET devices comprises at least a third pass-gate transistor, a fourth pass-gate transistor, a third pull-up transistor and a fourth pull-up transistor;
a third memory cell comprising a plurality of third multi-gate FET devices, wherein the plurality of third multi-gate FET devices comprises at least a fifth pass-gate transistor, a sixth pass-gate transistor, a fifth pull-up transistor and a sixth pull-up transistor;
a first fin structure coupled to the second pull-up transistor of the first memory cell and the fourth pull-up transistor of the second memory cell; and
a second fin structure coupled to the first pull-up transistor of the first memory cell and the fifth pull-up transistor of the third memory cell.

10. The multi-gate semiconductor device of claim 9, wherein the first fin structure and the second fin structure are parallel to each other.

11. The multi-gate semiconductor device of claim 9, wherein a length of the first fin structure and a length of the second fin structure are substantially the same.

12. The multi-gate semiconductor device of claim 9, wherein each of the first fin structure and the second fins structure comprises a plurality of first semiconductor layers and a plurality of second semiconductor layers, and the first semiconductor layers and the second semiconductor layers are alternately stacked over the substrate.

13. The multi-gate semiconductor device of claim 12, wherein the first semiconductor layer comprises a first semiconductor material and a second semiconductor material, the second semiconductor layer comprises the second semiconductor material, and a lattice constant of the first semiconductor material is different from a lattice constant of the second semiconductor material.

14. The multi-gate semiconductor device of claim 9, wherein a layout pattern of the first memory cell and a layout pattern of the second memory cell are line symmetrical about a first axis, and the layout pattern of the first memory cell and a layout pattern of the third memory cell are line symmetrical about a second axis.

15. The multi-gate semiconductor device of claim 14, wherein the first axis and the second axis are parallel to each other.

16. A multi-gate semiconductor device for memory comprising:
a first memory cell comprising a plurality of first multi-gate FET devices, wherein the plurality of first multi-gate FET devices comprises at least a first pass-gate transistor, a second pass-gate transistor, a first pull-up transistor and a second pull-up transistor;
a second memory cell comprising a plurality of second multi-gate FET devices, wherein the plurality of second multi-gate FET devices comprises at least a third pass-gate transistor, a fourth pass-gate transistor, a third pull-up transistor and a fourth pull-up transistor;
a third memory cell comprising a plurality of third multi-gate FET devices, wherein the plurality of third multi-gate FET devices comprises at least a fifth pass-gate transistor, a sixth pass-gate transistor, a fifth pull-up transistor and a sixth pull-up transistor;
a first fin structure coupled to the second pull-up transistor of the first memory cell and the fourth pull-up transistor of the second memory cell and extending along a first direction; and
a second fin structure coupled to the first pull-up transistor of the first memory cell and the third pull-up transistor of the third memory cell and extending along the first direction,
wherein a layout pattern of the first memory cell and a layout pattern of the second memory cell are line symmetrical about a first axis, the layout pattern of the first memory cell and a layout pattern of the third memory cell are line symmetrical about a second axis, and the first axis and the second axis extend along a second direction perpendicular to the first direction.

17. The multi-gate semiconductor device of claim 16, wherein a length of the first fin structure and a length of the second fin structure are substantially the same.

18. The multi-gate semiconductor device of claim 16, wherein the first multi-gate FET devices of the first memory cell comprise two first pull-down FET devices, the second multi-FET devices of the second memory cell comprise two second pull-down FET devices, and the third multi-gate FET devices of the third memory cell comprise two third pull-down FET devices.

19. The multi-gate semiconductor device of claim 13, wherein the first semiconductor layer is channel layers of the first pull-up transistor and the second pull-up transistor of the first memory cell, channel layers of the third pull-up transistor and the fourth pull-up transistor of the second memory cell, and channel layer of the fifth pull-up transistor and the sixth pull-up transistor of the third memory cell.

20. The multi-gate semiconductor device of claim 13, wherein the second semiconductor layer is channel layers of the first pass-gate transistor and the second pass-gate transistor of the first memory cell, channel layers of the third pass-gate transistor and the fourth pass-gate transistor of the second memory cell, and channel layer of the fifth pass-gate transistor and the sixth pass-gate transistor of the third memory cell.

* * * * *